United States Patent [19]
Rackley

[11] Patent Number: 5,229,657
[45] Date of Patent: Jul. 20, 1993

[54] METHOD AND APPARATUS FOR CONTROLLING SIMULTANEOUS SWITCHING OUTPUT NOISE IN BOUNDARY SCAN PATHS

[75] Inventor: David T. Rackley, Garland, Tex.

[73] Assignee: VLSI Technology, Inc., San Jose, Calif.

[21] Appl. No.: 694,532

[22] Filed: May 1, 1991

[51] Int. Cl.$^5$ ................ H03K 17/16; H03K 19/00
[52] U.S. Cl. .................... 307/443; 307/480; 307/272.2; 307/592
[58] Field of Search ............ 307/272.1, 272.2, 443, 307/480, 481, 269, 592, 594, 596

[56] References Cited

U.S. PATENT DOCUMENTS

| | | | |
|---|---|---|---|
| 4,570,082 | 2/1986 | Maley et al. | 307/272.2 |
| 4,857,765 | 8/1989 | Cahill et al. | 307/443 |
| 4,879,718 | 11/1989 | Sanner | 307/272.2 |
| 4,929,850 | 5/1990 | Breuninger | 307/443 |
| 4,970,405 | 11/1990 | Hagiwara | 307/480 |
| 4,982,118 | 1/1991 | Lloyd | 307/480 |
| 5,055,706 | 10/1991 | Nakai et al. | 307/592 |

FOREIGN PATENT DOCUMENTS 0190020  9/1985  Japan ..................... 307/443

Primary Examiner—Edward P. Westin
Assistant Examiner—Andrew Sanders
Attorney, Agent, or Firm—Douglas L. Weller

[57] ABSTRACT

An integrated circuit limits simultaneous switching output noise. Within the integrated circuit, a plurality of output pads are connected to an output holding register. The output holding register includes a plurality of flip-flops. Each flip-flop has a clock input, a data input, and a data output. The data output is connected to an output pad from the plurality of output pads. Various amounts of propagation delay are introduced in a clock signal before the clock signal reaches the clock inputs of the flip-flops.

11 Claims, 9 Drawing Sheets

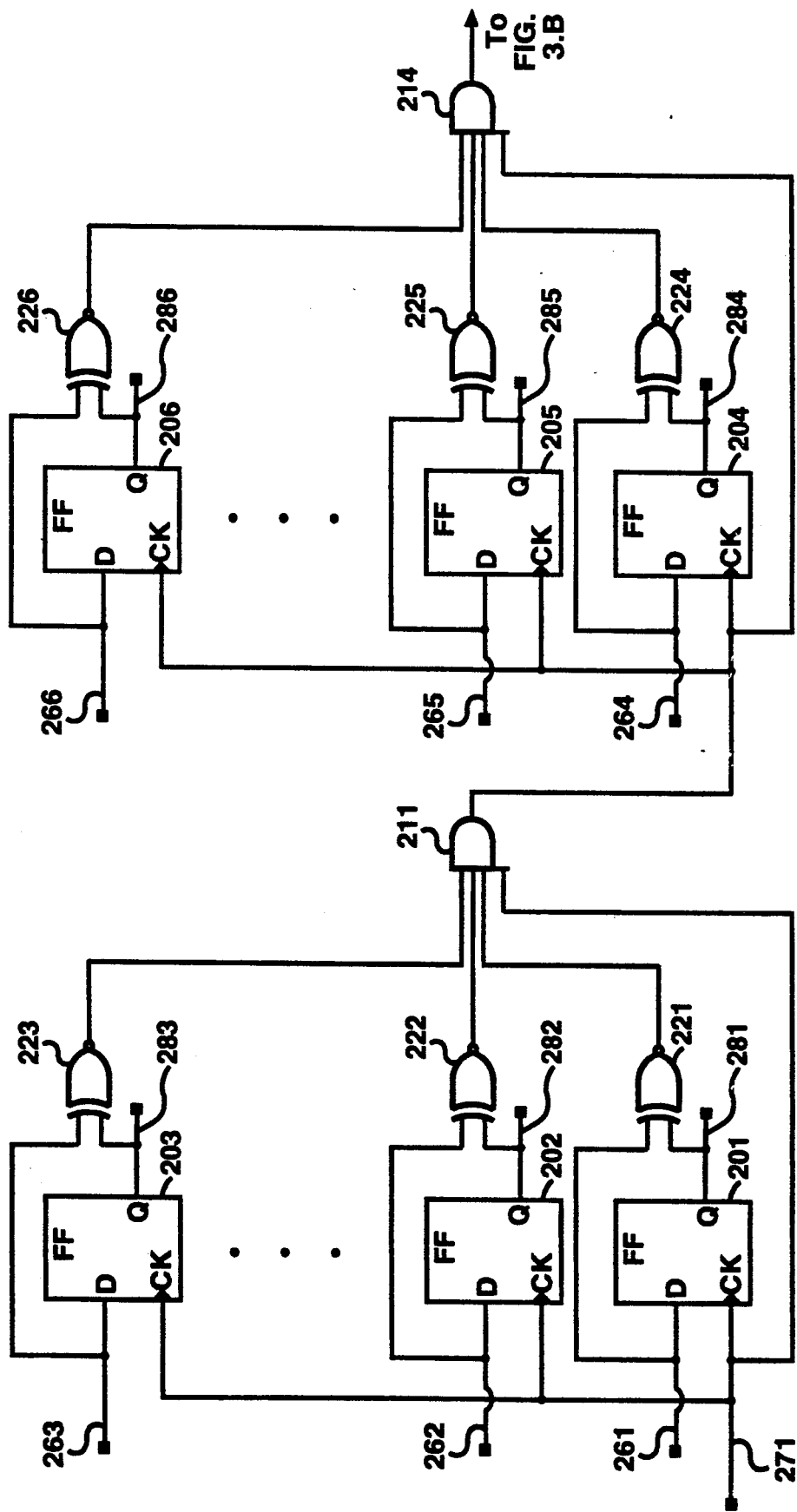
FIG. 3.A

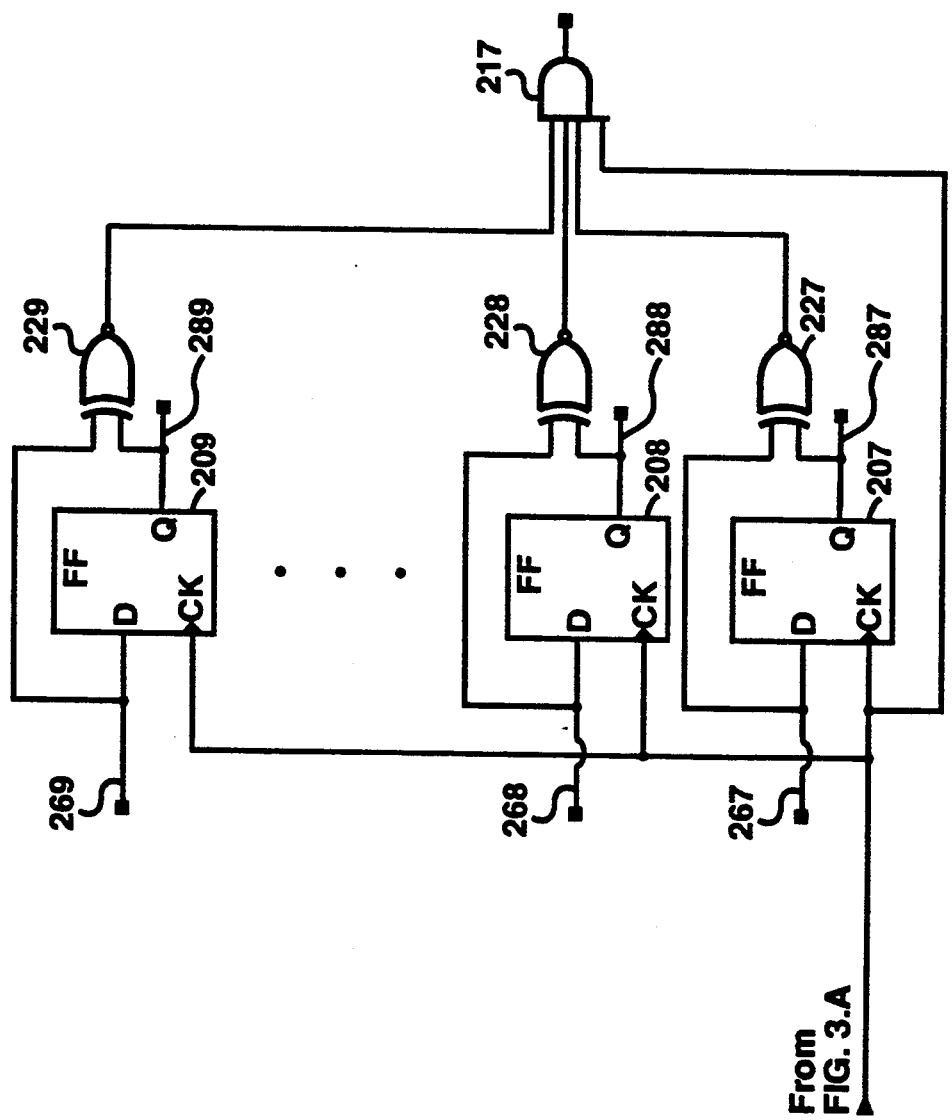
FIG. 3.B

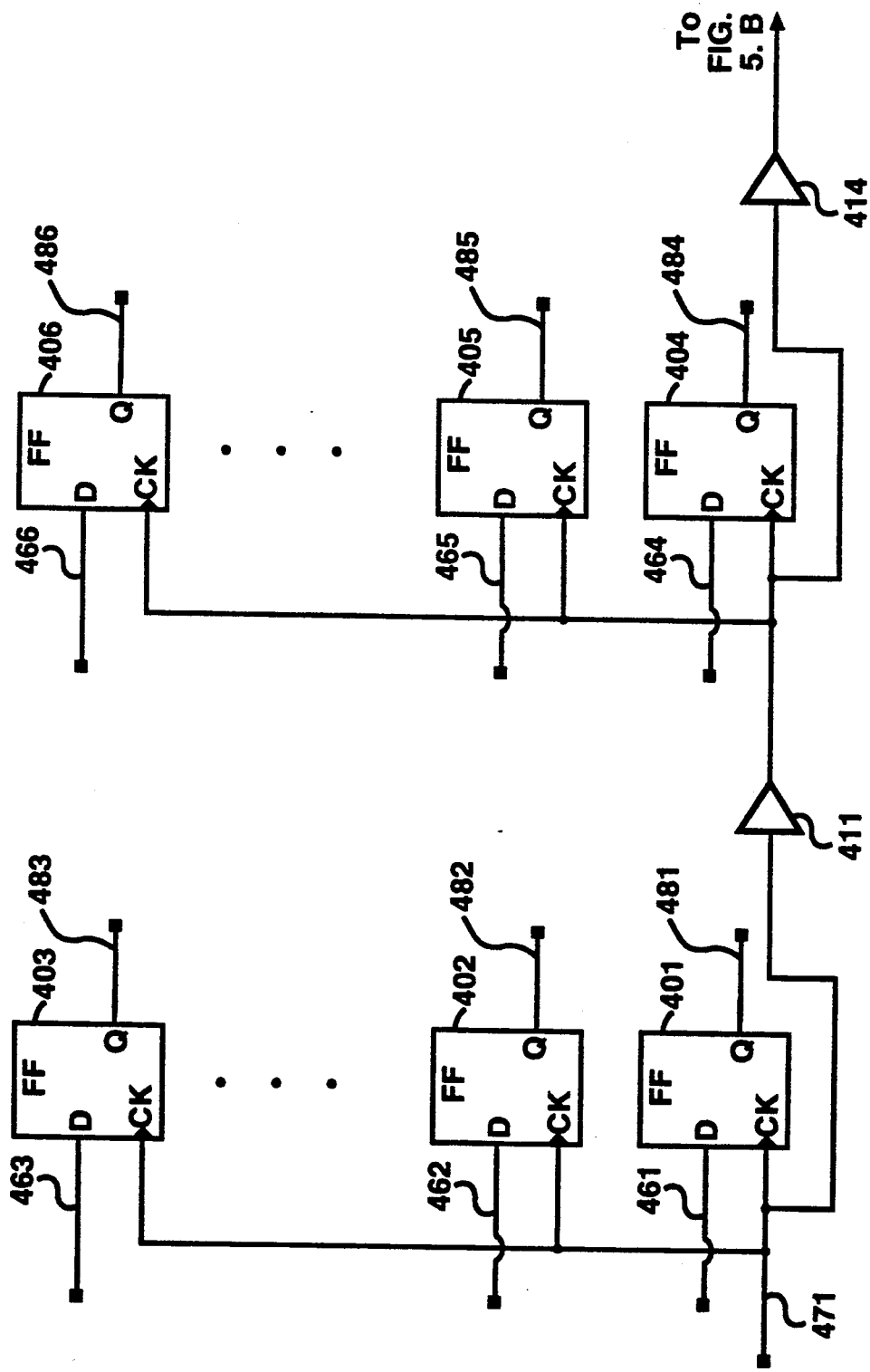
FIG. 5.A

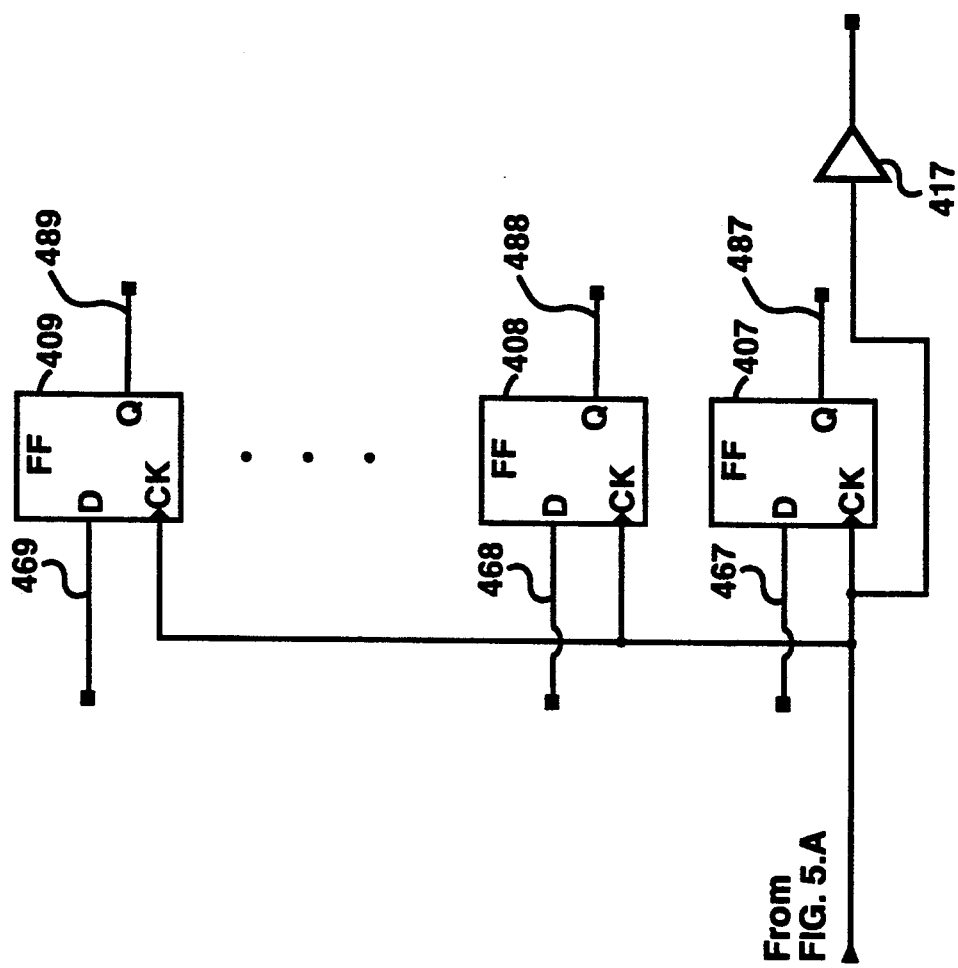

METHOD AND APPARATUS FOR CONTROLLING SIMULTANEOUS SWITCHING OUTPUT NOISE IN BOUNDARY SCAN PATHS

BACKGROUND

The present invention concerns the reduction of simultaneous switching noise in output circuitry on an integrated circuit.

In integrated circuits which are tested using a boundary scan test strategy, a serial shift register, also called a boundary scan register, is included for use in board level testing. The serial shift register allows that, with a reduced pin count, a test pattern can be loaded into the serial shift register and applied to the chip output pins during board level testing.

Generally, it is required that during the loading of the serial shift register, the values within the serial shift register not be reflected until after the loading of the serial register is complete. For this reason an additional output holding register is connected between the serial shift register and the output pins. This conforms with the Joint Test Action Group (JTAG) IEEE P1149 standard.

When a test pattern within the serial shift register is loaded into the output holding register, and subsequently driven onto the chip output pins, there exists a good possibility that many more output pins will be switching simultaneously than in the normal functional mode. This is because the testing is not constrained to system functional limitations, because all bit slices of the output holding register are uniform in design and hence each bit of output has a similar propagation delay, and because each test vector exercises as much as possible in order to reduce testing time and hence the cost of testing.

The level of simultaneous switching that occurs during testing can cause a larger amount of simultaneous switching output noise than occurs during normal operation. This excess simultaneous switching output noise can result in a degradation of performance of the integrated circuit during testing.

One way to overcome degradation of integrated circuit performance during testing because of increased simultaneous switching output noise is to design the integrated circuit so that sufficient current is available to reduce the simultaneous switching output noise. This, however, can greatly add to the expensive of the integrated circuit. Another way to overcome the degradation during testing is to limit the switching during the test by either blocking the test structures into groups and exercising them separately, or by writing the test patterns in such a way as to avoid excessive simultaneous switching output. This approach, however, limits the ability to observe test data and control testing and thus thwarts the goal of using boundary scan registers to eliminate such limitations.

SUMMARY OF THE INVENTION

In accordance with the preferred embodiment of the present invention, an integrated circuit is presented in which simultaneous switching output noise is limited. Within the integrated circuit, a plurality of output pads are connected to an output holding register. The output holding register includes a plurality of flip-flops. Each flip-flop has a clock input, a data input, and a data output. The data output is connected to an output pad from the plurality of output pads. Various amounts of propagation delay are introduced in a clock signal before the clock signal reaches the clock inputs of the flip-flops.

For example, the clock signals of each flip-flop may be serially connected through a buffer having a propagation delay.

Alternately, the clock inputs of the flip-flops may be connected together through logic gates which introduce propagation delay including propagation delay through a flip-flop. For instance, the logic gates between a first flip-flop and a second flip-flop may include a logical EXCLUSIVE NOR gate having a first input connected to a first data output of the first flip-flop and having a second input connected to a first data input of the first flip-flop and may include a logical AND gate having a first input connected to an output of the logical EXCLUSIVE NOR gate, having a second input connected to a first clock input on the first flip-flop, and having an output connected to a second clock input on the second flip-flop. When a tri-state driver is connected between the first flip-flop and the first output pad, the logic gates between the first flip-flop and the second flip-flop may include a first input buffer having an input connected to an output of the tri-state driver, a logical EXCLUSIVE NOR gate having a first input connected to an output of the first input buffer and having a second output connected to a first data input of the first flip-flop, and a logical AND gate having a first input connected to an output of the logical EXCLUSIVE NOR gate, having a second input connected to the first clock input on the first flip-flop, and having an output connected to the second clock input on the second flip-flop.

Often, it may not be necessary or desirable to introduce additional propagation delay for each flip-flop. In these cases, the flip-flops may be arranged in blocks so that within a block a clock input of each flip-flop is connected to a common block flip-flop line. Delay is introduced between each common block flip-flop line. This may be done, for example, by a buffer having propagation delay. Alternately, this may be done with other circuitry similar to that described above.

BRIEF DESCRIPTION OF THE DRAWINGS

FIGS. 3, 3A and 3B show circuitry added to an output holding register in order to limit simultaneous switching output noise in accordance with another alternate preferred embodiment of the present invention.

FIG. 5, 5A and 5B show circuitry added to an output holding register in order to limit simultaneous switching output noise in accordance with another alternate preferred embodiment of the present invention.

DESCRIPTION OF THE PREFERRED EMBODIMENT

Figure 1:
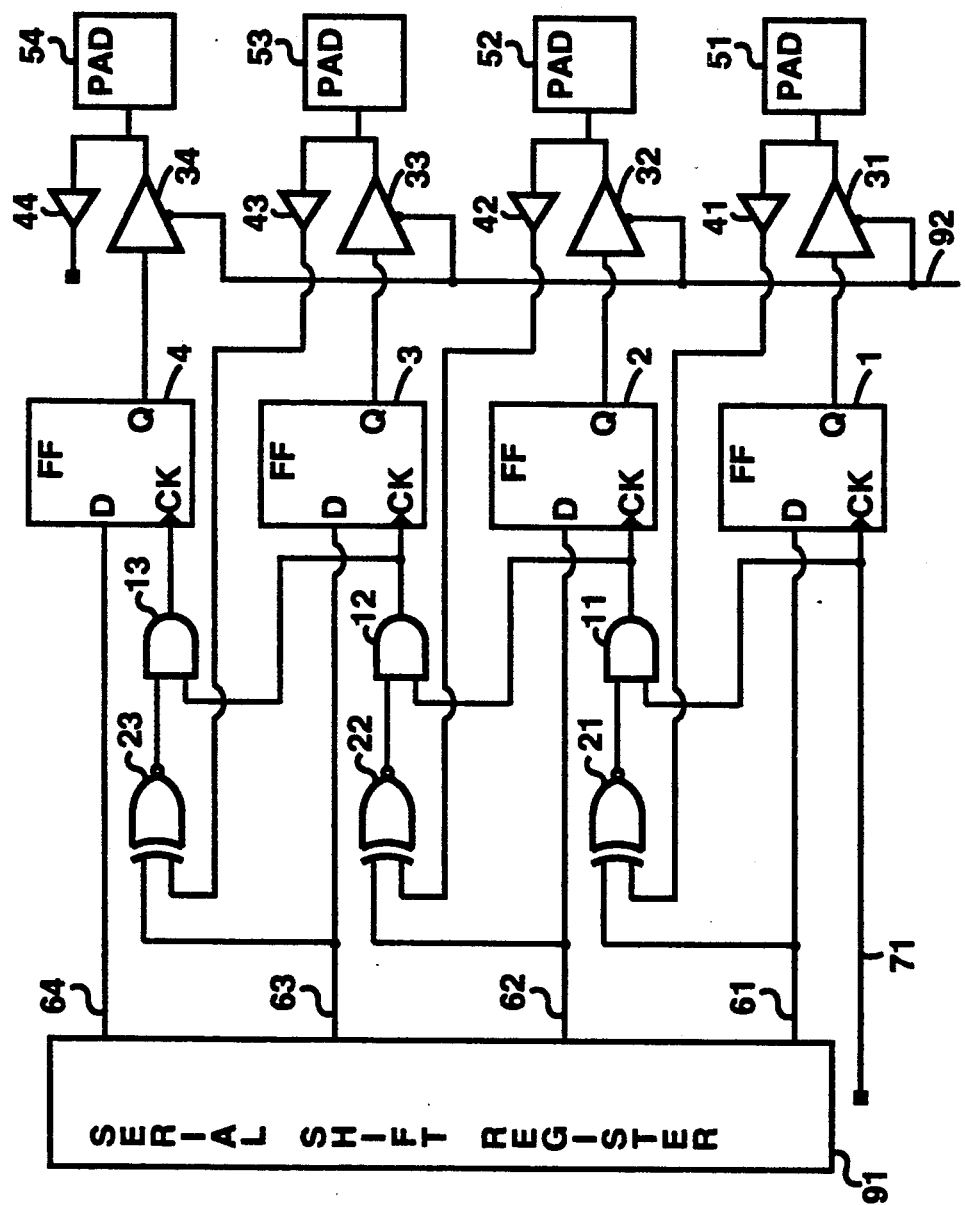
FIG. 1 shows circuitry added to an output holding register in order to limit simultaneous switching output noise in accordance with a preferred embodiment of the present invention.

FIG. 1 shows a portion of an output holding register used in the testing of an integrated circuit. The output holding register includes a plurality of flip-flops (FF)s each flip-flop holding one bit of data. For example, shown in FIG. 1 are a flip-flop 1, a flip-flop 2, a flip-flop 3, and a flip-flop 4.

Flip-flop 1, on a line 61, receives a bit of data from a serial shift register 91. Upon receiving a clock pulse on a clock (CK) input, flip-flop 1 transfers the bit of data from its D input to its Q output. During testing, the value on the Q output of flip-flop 1 is forwarded to a pad 51 through a tri-state driver 31. Tri-state driver 31 is controlled by a control line 92.

Flip-flop 2, on a line 62, receives a bit of data from serial shift register 91. Upon receiving a clock pulse on a clock (CK) input, flip-flop 2 transfers the bit of data from its D input to its Q output. During testing, the value on the Q output of flip-flop 2 is forwarded to a pad 52 through a tri-state driver 32. Tri-state driver 32 is controlled by control line 92.

Flip-flop 3, on a line 63, receives a bit of data from serial shift register 91 Upon receiving a clock pulse on a clock (CK) input, flip-flop 3 transfers the bit of data from its D input to its Q output. During testing, the value on the Q output of flip-flop 3 is forwarded to a pad 53 through a tri-state driver 33. Tri-state driver 33 is controlled by control line 92.

Flip-flop 4, on a line 64, receives a bit of data from serial shift register 91. Upon receiving a clock pulse on a clock (CK) input, flip-flop 4 transfers the bit of data from its D input to its Q output. During testing, the value on the Q output of flip-flop 4 is forwarded to a pad 54 through a tri-state driver 34. Tri-state driver 34 is controlled by control line 94.

A clock signal, placed on a clock line 71, is used to clock the output holding register. Flip-flop 1 receives the clock signal on its clock input. Rather than directly applying the clock signal to all other flip-flops in the output holding register, additional circuitry is added to introduce delay in propagation of the clock signal. This works to slightly offset the switching of output, thus reducing simultaneous switching output noise.

For example, when a bit of data on line 61 causes a switch in the data value on pad 51, propagation delay of the clock signal is equal to the combined propagation delay of data through flip-flop 1, tri-state driver 31, an input buffer 41, a logical EXCLUSIVE NOR gate 21, and a logical AND gate 11.

Similarly, additional propagation delay is introduced which further delays flip-flop 3 from receiving the clock signal. When a bit of data on line 62 causes a switch in the data value on pad 52, this propagation delay is the equivalent of the combined propagation delay of data through flip-flop 2, tri-state driver 32, an input buffer 42, a logical EXCLUSIVE NOR gate 22, and a logical AND gate 12.

Additional propagation delay is introduced which delays flip-flop 4 from receiving a clock signal. When a bit of data on line 63 causes a switch in the data value on pad 53, this propagation delay is the equivalent of the combined propagation delay of data through flip-flop 3, tri-state driver 33, an input buffer 43, a logical EXCLUSIVE NOR gate 23, and a logical AND gate 13. This embodiment of the present invention guarantees that each flip-flop will have non-overlapping switching times, which guarantees limits on the amount of switching noise.

Figure 2:
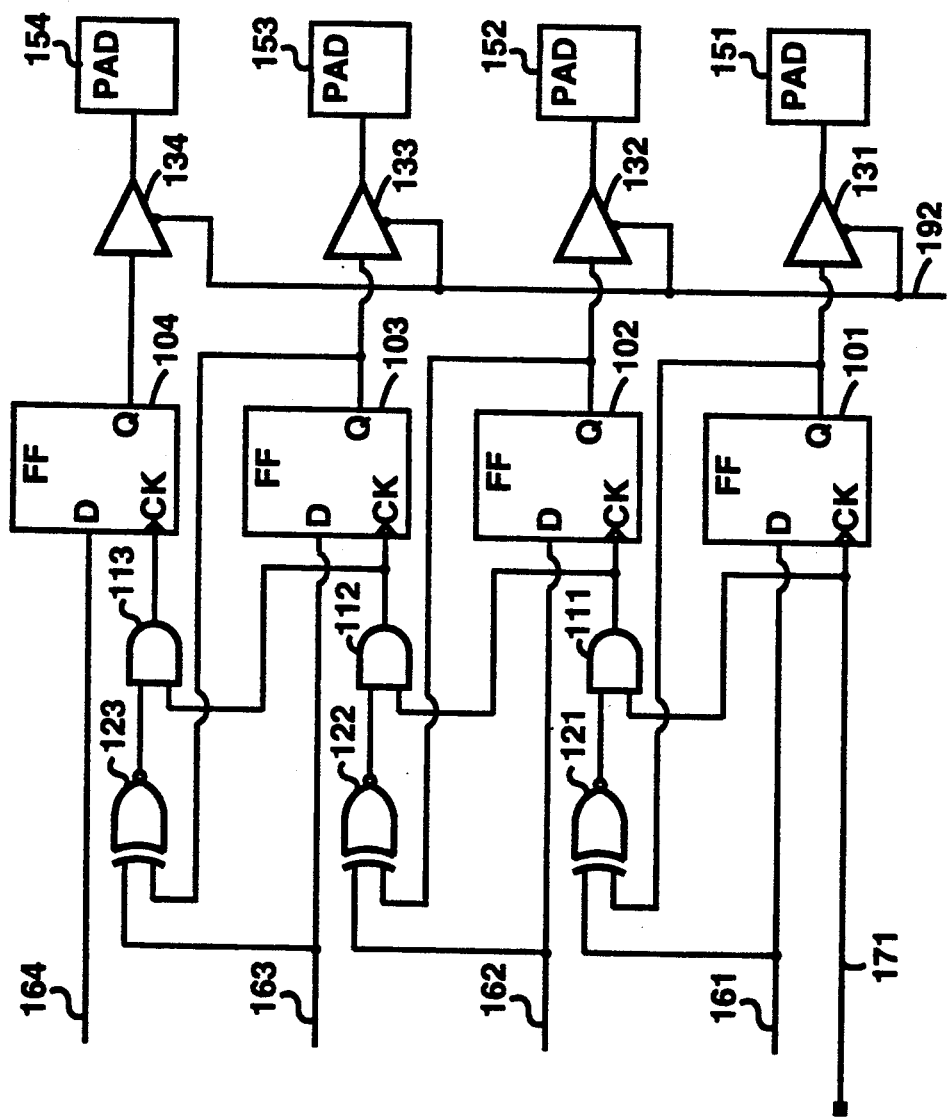
FIG. 2 shows circuitry added to an output holding register in order to limit simultaneous switching output noise in accordance with an alternate preferred embodiment of the present invention.

FIG. 2 shows an alternate embodiment of circuitry added to an output holding register which introduces less propagation delay to a clock signal In FIG. 2, the output holding register is shown to include a flip-flop 101, a flip-flop 102, a flip-flop 103, and a flip-flop 104.

Flip-flop 101, on a line 161, receives a bit of data from a serial shift register. Upon receiving a clock pulse on a clock (CK) input, flip-flop 101 transfers the bit of data from its D input to its Q output. During testing, the value on the Q output of flip-flop 101 is forwarded to a pad 151 through a tri-state driver 131. Tri-state driver 131 is controlled by a control line 192.

Flip-flop 102, on a line 162, receives a bit of data from the serial shift register. Upon receiving a clock pulse on a clock (CK) input, flip-flop 102 transfers the bit of data from its D input to its Q output. During testing, the value on the Q output of flip-flop 102 is forwarded to a pad 152 through a tri-state driver 132. Tri-state driver 132 is controlled by control line 192.

Flip-flop 103, on a line 163, receives a bit of data from the serial shift register. Upon receiving a clock pulse on a clock (CK) input, flip-flop 103 transfers the bit of data from its D input to its Q output. During testing, the value on the Q output of flip-flop 103 is forwarded to a pad 153 through a tri-state driver 133. Tri-state driver 133 is controlled by control line 192.

Flip-flop 104, on a line 164, receives a bit of data from the serial shift register. Upon receiving a clock pulse on a clock (CK) input, flip-flop 104 transfers the bit of data from its D input to its Q output. During testing, the value on the Q output of flip-flop 104 is forwarded to a pad 154 through a tri-state driver 134. Tri-state driver 134 is controlled by control line 194.

A clock signal, placed on a clock line 171, is used to clock the output holding register. Flip-flop 101 receives the clock signal on its clock input. Rather than directly applying the clock signal to all other flip-flops in the output holding register, additional circuitry is added to introduce delay in propagation of the clock signal. This works to slightly offset the switching of output, thus reducing simultaneous switching output noise.

For example, propagation delay is introduced which delays flip-flop 102 from receiving a clock signal. When a bit of data on line 161 causes a switch in the data value on pad 151, this propagation delay is the equivalent of the combined propagation delay of data through flip-flop 101, a logical EXCLUSIVE NOR gate 121, and a logical AND gate 111.

Similarly, additional propagation delay is introduced which delays flip-flop 103 from receiving a clock signal. When a bit of data on line 162 causes a switch in the data value on pad 152, this additional propagation delay is the equivalent of the combined propagation delay of data through flip-flop 102, a logical EXCLUSIVE NOR gate 122, and a logical AND gate 112.

Additional propagation delay is introduced which delays flip-flop 104 from receiving a clock signal. When a bit of data on line 163 causes a switch in the data value on pad 153, this additional propagation delay is the equivalent of the combined propagation delay of data through flip-flop 103, a logical EXCLUSIVE NOR gate 123, and a logical AND gate 113. This embodiment of the present invention will have slightly overlapping switching. Hence, the switching noise will be slightly higher than in the embodiment shown in FIG. 2. However, the embodiment shown in FIG. 3 has the advantage of not requiring input buffers, and thus requires fewer gates.

Figure 3:
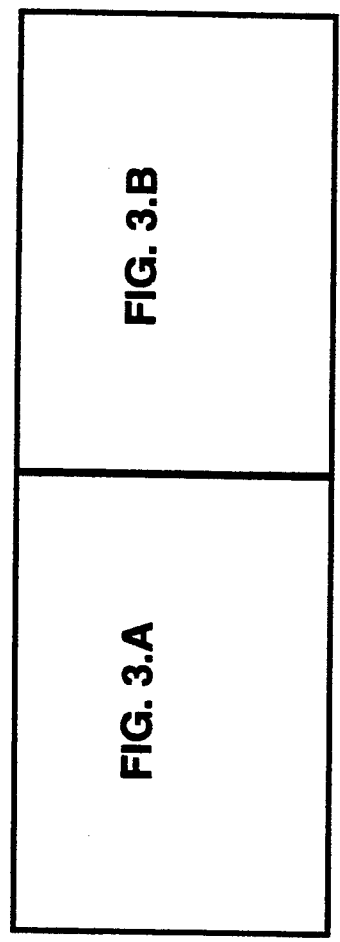

FIG. 3 shows an alternate embodiment of circuitry added to an output holding register which, over the entire output holding register, introduces less propagation delay to a clock signal. In FIG. 3, the output holding register is shown to include a flip-flop 201, a flip-flop 202, a flip-flop 203, a flip-flop 204, a flip-flop 205, a flip-flop 206, a flip-flop 207, a flip-flop 208, and a flip-flop 209.

Flip-flop 201, on a line 261, receives a bit of data from a serial shift register. Upon receiving a clock pulse on a clock (CK) input, flip-flop 201 transfers the bit of data from its D input to its Q output. During testing, the value on the Q output of flip-flop 201 is forwarded on a line 281 to a pad through a tri-state driver.

Flip-flop 202, on a line 262, receives a bit of data from a serial shift register. Upon receiving a clock pulse on a clock (CK) input, flip-flop 202 transfers the bit of data from its D input to its Q output. During testing, the value on the Q output of flip-flop 202 is forwarded on a line 282 to a pad through a tri-state driver.

Flip-flop 203, on a line 263, receives a bit of data from a serial shift register. Upon receiving a clock pulse on a clock (CK) input, flip-flop 203 transfers the bit of data from its D input to its Q output. During testing, the value on the Q output of flip-flop 203 is forwarded on a line 283 to a pad through a tri-state driver.

Flip-flop 204, on a line 264, receives a bit of data from a serial shift register. Upon receiving a clock pulse on a clock (CK) input, flip-flop 204 transfers the bit of data from its D input to its Q output. During testing, the value on the Q output of flip-flop 204 is forwarded on a line 284 to a pad through a tri-state driver.

Flip-flop 205, on a line 265, receives a bit of data from a serial shift register. Upon receiving a clock pulse on a clock (CK) input, flip-flop 205 transfers the bit of data from its D input to its Q output. During testing, the value on the Q output of flip-flop 205 is forwarded on a line 285 to a pad through a tri-state driver.

Flip-flop 206, on a line 266, receives a bit of data from a serial shift register. Upon receiving a clock pulse on a clock (CK) input, flip-flop 206 transfers the bit of data from its D input to its Q output. During testing, the value on the Q output of flip-flop 201 is forwarded on a line 286 to a pad through a tri-state driver.

Flip-flop 207, on a line 267, receives a bit of data from a serial shift register. Upon receiving a clock pulse on a clock (CK) input, flip-flop 207 transfers the bit of data from its D input to its Q output. During testing, the value on the Q output of flip-flop 207 is forwarded on a line 287 to a pad through a tri-state driver.

Flip-flop 208, on a line 268, receives a bit of data from a serial shift register. Upon receiving a clock pulse on a clock (CK) input, flip-flop 208 transfers the bit of data from its D input to its Q output. During testing, the value on the Q output of flip-flop 208 is forwarded on a line 288 to a pad through a tri-state driver.

Flip-flop 209, on a line 269, receives a bit of data from a serial shift register. Upon receiving a clock pulse on a clock (CK) input, flip-flop 209 transfers the bit of data from its D input to its Q output. During testing, the value on the Q output of flip-flop 209 is forwarded on a line 289 to a pad through a tri-state driver.

A clock signal, placed on a clock line 271, is used to clock the output holding register. For the embodiment shown in FIG. 3, the flip-flops are arranged in blocks. There may be any number of flip-flops in a block. The clock signal is delayed between blocks instead of between individual flip-flops.

For example, in FIG. 3 there is shown to be three flip-flops per block. Flip-flop 201, flip-flop 202 and flip-flop 203 receive the clock signal on clock line 271 on their respective clock inputs. A logical AND gate 211 guarantees that all of flip-flops 201, 202 and 203 have finished switching before the clock signal on clock line 271 is propagated to flip-flop 204, flip-flop 205 and flip-flop 206.

For example, when a bit of data on line 261 causes a switch in the data value on line 281, a bit of data on line 262 causes a switch in the data value on line 282, and/or a bit of data on line 263 causes a switch in the data value on line 283, then an additional propagation delay is introduced which respectively is equal to the propagation delay through flip-flop 201 and a logical EXCLUSIVE NOR gate 221, the propagation delay through flip-flop 202 and a logical EXCLUSIVE NOR gate 222, or the propagation delay through flip-flop 203 and a logical EXCLUSIVE NOR gate 223, whichever is longer.

Flip-flop 203, flip-flop 205 and flip-flop 206 receive, on their respective clock inputs, the clock signal from logical AND gate 211. A logical AND gate 214 guarantees that all of flip-flops 203, 204 and 205 have finished switching before the clock signal originally on clock line 271 is propagated to flip-flop 207, flip-flop 208 and flip-flop 209.

For example, when a bit of data on line 264 causes a switch in the data value on line 284, a bit of data on line 265 causes a switch in the data value on line 285, and/or a bit of data on line 266 causes a switch in the data value on line 286, then an additional propagation delay is introduced which respectively is equivalent to the propagation delay through flip-flop 204 and a logical EXCLUSIVE NOR gate 224, the propagation delay through flip-flop 205 and a logical EXCLUSIVE NOR gate 225, or the propagation delay through flip-flop 206 and a logical EXCLUSIVE NOR gate 226, whichever is longer.

· Flip-flop 207, flip-flop 208 and flip-flop 209 receive, on their respective clock inputs, the clock signal from logical AND gate 214. A logical AND gate 217 guarantees that all of flip-flops 207, 208 and 209 have finished switching before the clock signal originally on clock line 271 is propagated to other flip-flops in the output holding register.

For example, when a bit of data on line 267 causes a switch in the data value on line 287, a bit of data on line 268 causes a switch in the data value on line 288, and/or a bit of data on line 269 causes a switch in the data value on line 289, then an additional propagation delay is introduced which respectively is equivalent to the propagation delay through flip-flop 207 and a logical EXCLUSIVE NOR gate 227, the propagation delay through flip-flop 208 and a logical EXCLUSIVE NOR gate 228, or the propagation delay through flip-flop 209 and a logical EXCLUSIVE NOR gate 229.

Figure 4:
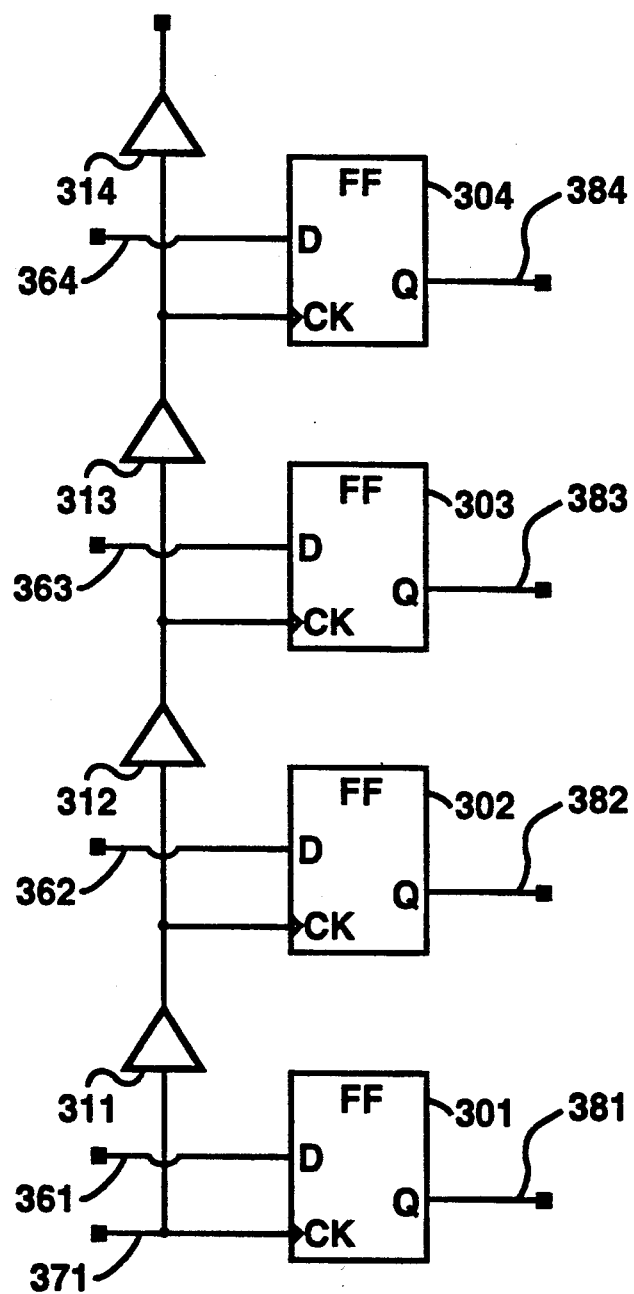
FIG. 4 shows circuitry added to an output holding register in order to limit simultaneous switching output noise in accordance with another alternate preferred embodiment of the present invention.

FIG. 4 shows an alternate embodiment of circuitry added to an output holding register which introduces propagation delay to a clock signal. In FIG. 4, the output holding register is shown to include a flip-flop 301, a flip-flop 302, a flip-flop 303, and a flip-flop 304.

Flip-flop 301, on a line 361, receives a bit of data from a serial shift register. Upon receiving a clock pulse on a clock (CK) input, flip-flop 301 transfers the bit of data from its D input to its Q output. During testing, the value on the Q output of flip-flop 301 is forwarded to a pad through a tri-state driver.

Flip-flop 302, on a line 362, receives a bit of data from the serial shift register. Upon receiving a clock pulse on a clock (CK) input, flip-flop 302 transfers the bit of data from its D input to its Q output. During testing, the value on the Q output of flip-flop 302 is forwarded to a pad through a tri-state driver.

Flip-flop 303, on a line 363, receives a bit of data from the serial shift register. Upon receiving a clock pulse on a clock (CK) input, flip-flop 303 transfers the bit of data from its D input to its Q output. During testing, the value on the Q output of flip-flop 303 is forwarded to a pad through a tri-state driver.

Flip-flop 304, on a line 364, receives a bit of data from the serial shift register. Upon receiving a clock pulse on a clock (CK) input, flip-flop 304 transfers the bit of data from its D input to its Q output. During testing, the value on the Q output of flip-flop 304 is forwarded to a pad through a tri-state driver.

A clock signal, placed on a clock line 371, is used to clock the output holding register. Flip-flop 301 receives the clock signal on its clock input. Rather than directly applying the clock signal to all other flip-flops in the output holding register, additional circuitry is added to introduce delay in propagation of the clock signal. This works to slightly offset the switching of output, thus reducing simultaneous switching output noise.

For example, propagation delay is introduced which delays flip-flop 302 from receiving a clock signal. This propagation delay is equivalent to the propagation delay through a buffer 311.

Similarly, additional propagation delay is introduced which delays flip-flop 303 from receiving a clock signal. This additional propagation delay is equivalent to the propagation delay through a buffer 312.

Additional propagation delay is introduced which delays flip-flop 304 from receiving a clock signal. This additional propagation delay is equivalent to the propagation delay through a buffer 313. A buffer 314 adds additional propagation delay for other flip-flops in the output holding register.

Figure 5:
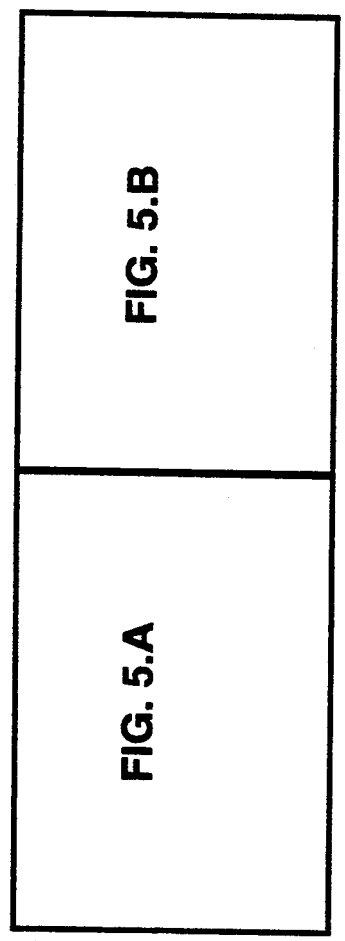

FIG. 5 shows an alternate embodiment of circuitry added to an output holding register which, over the entire output holding register, introduces propagation delay to a clock signal. In FIG. 5, the output holding register is shown to include a flip-flop 401, a flip-flop 402, a flip-flop 403, a flip-flop 404, a flip-flop 405, a flip-flop 406, a flip-flop 407, a flip-flop 408, and a flip-flop 409.

Flip-flop 401, on a line 461, receives a bit of data from a serial shift register. Upon receiving a clock pulse on a clock (CK) input, flip-flop 401 transfers the bit of data from its D input to its Q output. During testing, the value on the Q output of flip-flop 401 is forwarded on a line 481 to a pad through a tri-state driver.

Flip-flop 402, on a line 462, receives a bit of data from a serial shift register. Upon receiving a clock pulse on a clock (CK) input, flip-flop 402 transfers the bit of data from its D input to its Q output. During testing, the value on the Q output of flip-flop 402 is forwarded on a line 482 to a pad through a tri-state driver.

Flip-flop 403, on a line 463, receives a bit of data from a serial shift register. Upon receiving a clock pulse on a clock (CK) input, flip-flop 403 transfers the bit of data from its D input to its Q output. During testing, the value on the Q output of flip-flop 403 is forwarded on a line 483 to a pad through a tri-state driver.

Flip-flop 404, on a line 464, receives a bit of data from a serial shift register. Upon receiving a clock pulse on a clock (CK) input, flip-flop 404 transfers the bit of data from its D input to its Q output. During testing, the value on the Q output of flip-flop 404 is forwarded on a line 484 to a pad through a tri-state driver.

Flip-flop 405, on a line 465, receives a bit of data from a serial shift register. Upon receiving a clock pulse on a clock (CK) input, flip-flop 405 transfers the bit of data from its D input to its Q output. During testing, the value on the Q output of flip-flop 405 is forwarded on a line 485 to a pad through a tri-state driver.

Flip-flop 406, on a line 466, receives a bit of data from a serial shift register. Upon receiving a clock pulse on a clock (CK) input, flip-flop 406 transfers the bit of data from its D input to its Q output. During testing, the value on the Q output of flip-flop 401 is forwarded on a line 486 to a pad through a tri-state driver.

Flip-flop 407, on a line 467, receives a bit of data from a serial shift register. Upon receiving a clock pulse on a clock (CK) input, flip-flop 407 transfers the bit of data from its D input to its Q output. During testing, the value on the Q output of flip-flop 407 is forwarded on a line 487 to a pad through a tri-state driver.

Flip-flop 408, on a line 468, receives a bit of data from a serial shift register Upon receiving a clock pulse on a clock (CK) input, flip-flop 408 transfers the bit of data from its D input to its Q output. During testing, the value on the Q output of flip-flop 408 is forwarded on a line 488 to a pad through a tri-state driver.

Flip-flop 409, on a line 469, receives a bit of data from a serial shift register. Upon receiving a clock pulse on a clock (CK) input, flip-flop 409 transfers the bit of data from its D input to its Q output. During testing, the value on the Q output of flip-flop 409 is forwarded on a line 489 to a pad through a tri-state driver.

A clock signal, placed on a clock line 471, is used to clock the output holding register. For the embodiment shown in FIG. 3, the flip-flops are arranged in blocks. There may be any number of flip-flops in a block. The clock signal is delayed between blocks instead of between individual flip-flops.

For example, in FIG. 5 there is shown to be three flip-flops per block. Flip-flop 401, flip-flop 402 and flip-flop 403 receive the clock signal on clock line 471 on their respective clock inputs. A buffer 411 introduces propagation delay in the clock signal on clock line 471 which delays the clock signal before it reaches flip-flop 404, flip-flop 405 and flip-flop 406.

Flip-flop 403, flip-flop 405 and flip-flop 406 receive, on their respective clock inputs, the clock signal from buffer 411. A buffer 414 introduces additional propagation delay in the clock signal which further delays the clock signal before the clock signal reaches flip-flop 407, flip-flop 408 and flip-flop 409.

Flip-flop 407, flip-flop 408 and flip-flop 409 receive, on their respective clock inputs, the clock signal from buffer 414. A buffer 417 introduces additional propagation delay in the clock signal which further delays the clock signal before it reaches other flip-flops in the output holding register.

I claim:
1. An integrated circuit comprising:
   a plurality of output pads, each output pad including a conductive area to which other devices not included on the integrated circuit may be electrically connected to the integrated circuit for the purpose of receiving output from the integrated circuit;

an output holding register, including a plurality of flip-flops, each flip-flop having a clock input, a data input, and a data output coupled to an output pad;

a clock line on which a clock signal is placed, the clock line being directly coupled to a first clock input on a first flip-flop; and, logic circuitry connected between the first clock input on the first flip-flop and a second clock input on a flip-flop, the logic circuitry introducing propagation delay in the clock signal before the clock signal reaches the second clock input, the propagation delay including propagation delay through the first flip-flop.

2. An integrated circuit as in claim 1 wherein the logic circuitry is a buffer.

3. An integrated circuit comprising:

a plurality of output pads, each output pad including a conductive area to which other devices not included on the integrated circuit may be electrically connected to the integrated circuit for the purpose of receiving output from the integrated circuit;

an output holding register, including a plurality of flip-flops, each flip-flop having a clock input, a data input, and a data output coupled to an output pad;

a clock line on which a clock signal is placed, the clock line being directly coupled to a first clock input on a first flip-flop; and, logic circuitry connected between the first clock input on the first flip-flop and a second clock input on a flip-flop, the logic circuitry introducing propagation delay in the clock signal before the clock signal reaches the second clock input, wherein the logic circuitry comprises a logical EXCLUSIVE NOR gate having a first input coupled to a first data output of the first flip-flop and having a second input coupled to a first data input of the first flip-flop, and a logical AND gate having a first input connected to an output of the logical EXCLUSIVE NOR gate, having a second input connected to the first clock input on the first flip-flop, and having an output connected to the second clock input on the second flip-flop.

4. An integrated circuit comprising:

a plurality of output pads, each output pad including a conductive area to which other devices not included on the integrated circuit may be electrically connected to the integrated circuit for the purpose of receiving output from the integrated circuit;

an output holding register, including a plurality of flip-flops, each flip-flop having a clock input, a data input, and a data output coupled to an output pad;

a clock line on which a clock signal is placed, the clock line being directly coupled to a first clock input on a first flip-flop; and, logic circuitry connected between the first clock input on the first flip-flop and a second clock input on a flip-flop, the logic circuitry introducing propagation delay in the clock signal before the clock signal reaches the second clock input;

wherein a tri-state driver is coupled between a first data output of the first flip-flop and a first output pad and wherein the logic circuitry comprises a first input buffer having an input coupled to an output of the tri-state driver, a logical EXCLUSIVE NOR gate having a first input coupled to an output of the first input buffer and having a second input coupled to a first data input of the first flip-flop, and, a logical AND gate having a first input connected to an output of the logical EXCLUSIVE NOR gate, having a second input connected to the first clock input on the first flip-flop, and having an output connected to the second clock input on the second flip-flop.

5. An integrated circuit as in claim 1 additionally comprising a serial shift register coupled to the data input of each flip-flop in the output holding register.

6. An integrated circuit comprising:

a plurality of output pads, an output holding register, including a plurality of blocks of flip-flops, each flip-flop having a clock input, a data input, and a data output coupled to an output pad, all flip-flops within each block of flip-flops being connected to a common block flip-flop line;

a clock line on which a clock signal is placed, the clock line being directly coupled to a first common block flip-flop line for a first block of flip-flops; and, logic circuitry connected between the first common block flip-flop line for the first block of flip-flops and a second common block flip-flop line for a second block of flip-flops, the logic circuitry introducing propagation delay in the clock signal before the clock signal reaches the second common block flip-flop line, the propagation delay including propagation delay through at least one flip-flop from the first block of flip-flops.

7. An integrated circuit as in claim 6 wherein the logic circuitry is a buffer.

8. An integrated circuit as in claim 6 wherein the logic circuitry comprises:

for every flip-flop in the first block of flip-flops, a logical EXCLUSIVE NOR gate having a first input coupled to a data output of the flip-flop and having a second input coupled to a data input of the flip-flop; and, a logical AND gate having a first input coupled to the first common block flip-flop line and having additional inputs coupled to outputs of each of the logical EXCLUSIVE NOR gates, and having an output connected to the second common block flip-flop line.

9. An integrated circuit as in claim 6 additionally comprising a serial shift register coupled to the data input of each flip-flop in the output holding register.

10. In an integrated circuit, a method for limiting simultaneous switching output noise on a plurality of output pads, the method comprising the steps of:

(a) providing, by the integrated circuit to other devices not included on the integrated circuit, output signals via output pads, each output pad including a conductive area by which the other devices may be electrically connected to the integrated circuit;

(b) providing the output signals from the integrated circuit to the output pads via an output holding register wherein the output holding register includes a plurality of flip-flops, each flip-flop having a clock input, a data input, and a data output coupled to an output pad; and, (c) introducing various amounts of propagation delay in a clock signal before the clock signal reaches the clock inputs of the flip-flops, the propagation delay being introduced by logic circuitry, including the substeps of (c,1) connecting a clock input of a first flip-flop directly to the clock signal, and (c,2) serially connecting the clock inputs of the flip-flops together, the serial connections being made through logic gates, the logic gates introducing propagation delay including propagation delay through a one of said plurality of flip-flops.

11. In an integrated circuit, a method for limiting simultaneous switching output noise on a plurality of output pads, the method comprising the steps of:

(a) providing, by the integrated circuit to other devices not included on the integrated circuit, output signals via output pads, each output pad including a conductive area by which the other devices may be electrically connected to the integrated circuit;

(b) providing the output signals from the integrated circuit to the output pads via an output holding register wherein the output holding register includes a plurality of flip-flops, each flip-flop having a clock input, a data input, and a data output coupled to an output pad; and, (c) introducing various amounts of propagation delay in a clock signal before the clock signal reaches the clock inputs of the flip-flops, the propagation delay being introduced by logic circuitry, including the substeps of (c.1) arranging the flip-flops in blocks so that within a block a clock input of each flip-flop is connected to a common block flip-flop line, (c.2) connecting a first common block flip-flop line of a first block of flip-flops directly to the clock signal, and (c.3) serially connecting the common block flip-flop lines together, the serial connections being made through logic gates, the logic gates introducing propagation delay including propagation delay through a flip-flop.

* * * * *